(12) United States Patent
Ljungcrantz et al.

(10) Patent No.: US 7,993,456 B2
(45) Date of Patent: Aug. 9, 2011

(54) DEVICE FOR CARRYING OUT A SURFACE TREATMENT OF SUBSTRATES UNDER VACUUM

(75) Inventors: Henrik Ljungcrantz, Linköping (SE); Torsten Rosell, Linköping (SE)

(73) Assignee: Impact Coatings AB, Linkoping (SE)

( * ) Notice: Subject to any disclaimer, the term of this patent is extended or adjusted under 35 U.S.C. 154(b) by 1051 days.

(21) Appl. No.: 10/534,723

(22) PCT Filed: Nov. 11, 2003

(86) PCT No.: PCT/SE03/01741
§ 371 (c)(1),
(2), (4) Date: Nov. 8, 2006

(87) PCT Pub. No.: WO2004/044263
PCT Pub. Date: May 27, 2004

(65) Prior Publication Data
US 2007/0084401 A1  Apr. 19, 2007

(30) Foreign Application Priority Data
Nov. 13, 2002 (SE) ...................................... 0203332

(51) Int. Cl.
*C23C 16/00* (2006.01)
*C23C 14/00* (2006.01)
*C23F 1/00* (2006.01)

(52) U.S. Cl. ........ 118/719; 118/728; 118/729; 118/730; 118/733; 156/345.31; 156/345.32; 156/345.51; 156/345.54; 156/345.55

(58) Field of Classification Search .................. 118/719, 118/733; 156/345.32, 345.31
See application file for complete search history.

(56) References Cited

U.S. PATENT DOCUMENTS

| 3,981,791 A | | 9/1976 | Rosvold | |
|---|---|---|---|---|
| 4,226,208 A | * | 10/1980 | Nishida et al. | 118/706 |
| 5,415,729 A | * | 5/1995 | Strasser et al. | 216/67 |
| 5,820,329 A | * | 10/1998 | Derbinski et al. | 414/225.01 |

* cited by examiner

*Primary Examiner* — Karla Moore
(74) *Attorney, Agent, or Firm* — Harness, Dickey & Pierce, P.L.C.

(57) ABSTRACT

The present invention relates to a device for carrying out a surface treatment of substrates under vacuum, which comprises a housing (1) comprising chambers (2-5) communicate with a vacuum source, at least one of which chambers serves as vacuum lock to the remaining chambers when surface treatment processes are in progress. The housing (1) is divided into an upper and a lower housing half (6, 7) of which at least one has symmetrically distributed recesses (8). Pivotally mounted between the housing halves (6, 7) is a revolver (9), which comprises recesses (10) in which substrate to be treated is placed. The housing halves (6, 7) are designed to be in two positions, in the first of which they are separated from the revolver (9) and in the second of which they are in contact therewith. In the first position the revolver (9) is designed to be turned to predefined rotational positions at which recesses in the housing halves (6, 7) and the revolver (9) coincide in the chambers (2-5). In the first position the vacuum lock can be opened and evacuated without disturbing the vacuum in other parts of the housing (1).

14 Claims, 2 Drawing Sheets

DEVICE FOR CARRYING OUT A SURFACE TREATMENT OF SUBSTRATES UNDER VACUUM

Example embodiments relate to a device for carrying out a surface treatment of substrates under vacuum.

BACKGROUND

Treating the surface of an object or coating this with a thin film with the aim of giving the object improved characteristics is a method long known in the art. In addition to using surface treatment for purely decorative applications, tools, machine parts and electronic components, among other things, are also surface-treated. Such treatments are furthermore used in medical and optical contexts.

The majority of surface treatment processes are performed under vacuum. Examples of such processes include so-called PVD, CVD and sputtering, among other things for cleaning surfaces.

The prior art includes a so-called cluster system for the surface treatment of substrates under vacuum, which comprises a robot for moving the substrate between a number of process chambers, in which each respective surface treatment process is performed. Such a robot must serve the system process chambers sequentially, which limits the efficiency of the system. A robot of this type may involve advanced electronics and software. In addition, with cluster systems there may be difficulty in arranging them so that the time which each substrate spends in a vacuum is the same for all substrates. Some cluster systems are only designed to be capable of handling one type of substrate, and if the system is to treat other types of substrate a system conversion will be required, which may be difficult and costly to undertake.

SUMMARY

One object of example embodiments is to provide a device for improved movement of substrates between chambers contained in the device.

This object is achieved by a device of the generic type in that the invention has the characterising features according to claim 1.

In the device according to example embodiments, moreover, the majority of surface treatment processes are performed in parallel, which makes the surface treatment more efficient than in the prior art.

Furthermore, example embodiments afford an advantage in that the total surface processing time spent in the device is equal for all substrates.

BRIEF DESCRIPTION OF THE DRAWINGS

A preferred embodiment of the device according to the invention will be explained in more detail below with reference to the drawing attached, in which.

DETAILED DESCRIPTION OF EXAMPLE EMBODIMENTS

Figure 1:
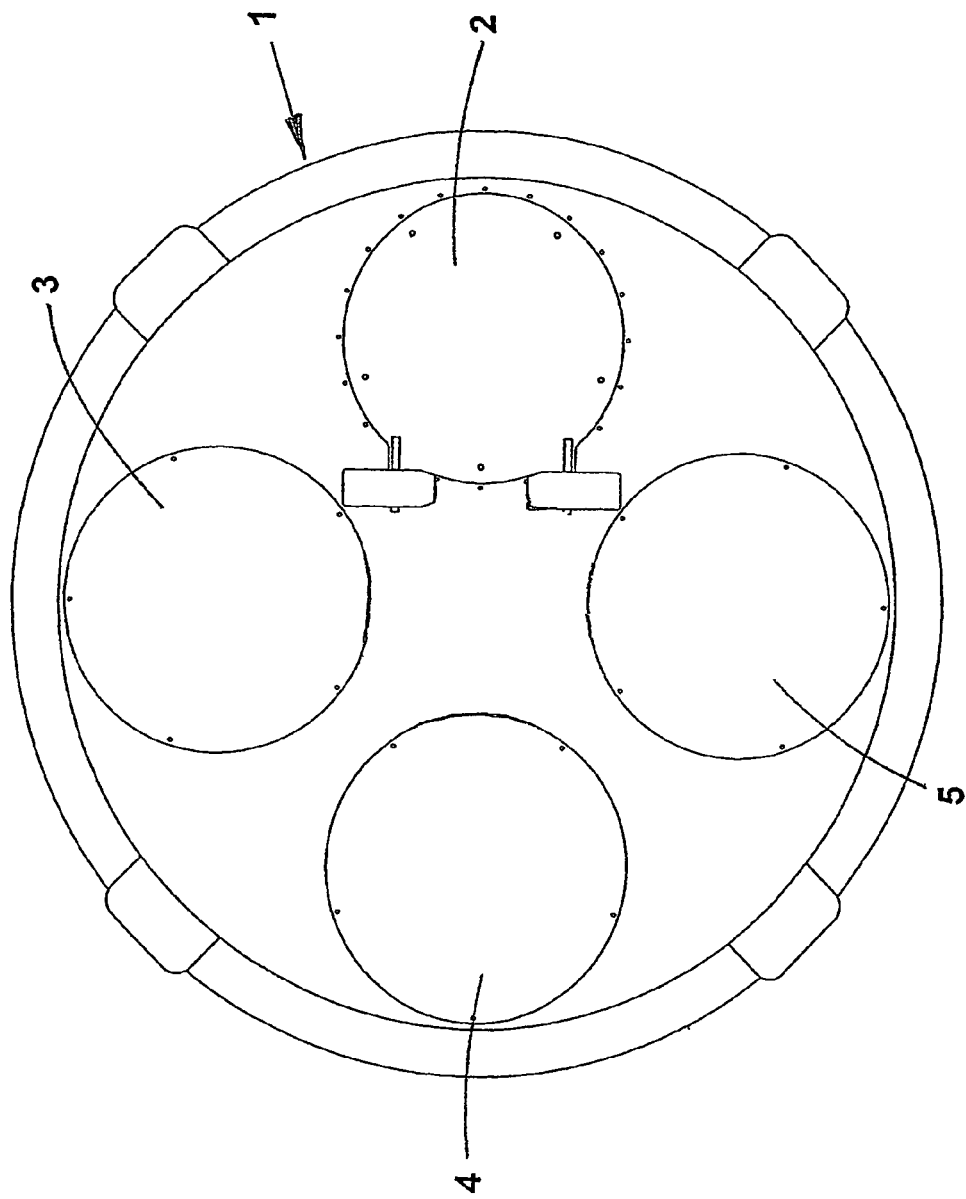
FIG. 1 shows a schematic plan view of a preferred embodiment of the device.

The device comprises a housing 1, which has an upper and a lower housing half 6, 7, between which a revolver 9 is pivotally mounted. In a preferred embodiment the housing halves 6, 7 comprise symmetrically distributed, opposing and co-incident recesses 8, preferably of the same dimensions, which constitute chambers 2-5. Of the chambers 2-5, one constitutes a vacuum lock chamber 2 to the remaining chambers 3-5, which constitute process chambers, as illustrated in FIG. 1. The device is provided with an external vacuum source, such as a vacuum pump, for example, which communicates with the chambers 2-5 through an opening (not shown) in each chamber, which are designed so that the chambers are in communication with one another only to a negligible extent.

Figure 2:
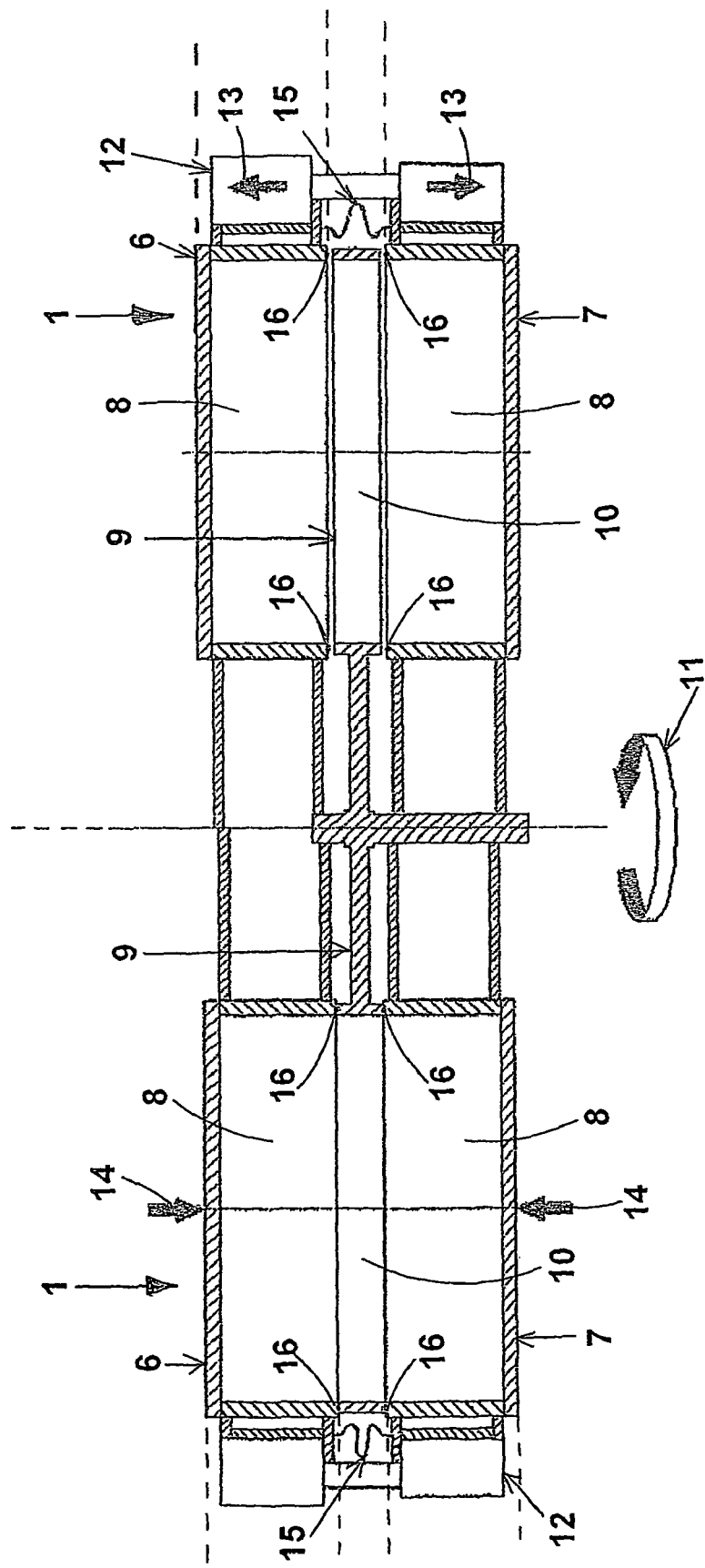
FIG. 2 shows a schematic section through the device in FIG. 1 in two positions, the left-hand part depicting a first position and the right-hand part depicting a second position.

It will be seen from FIG. 2 that the housing halves 6, 7 are designed to assume either of two positions, in the first of which they are in contact with the revolver 9, which is then prevented from turning. In the second position the housing halves are separated from the revolver 9, so that this is capable of rotating. Acting between the housing halves are hydraulic members 12, such as cylinders, for example, which are designed to set the housing halves 6, 7 to the second position by means of a hydraulic force, illustrated by an arrow 13. The upper and lower housing halves 6, 7 are furthermore designed to return to the first position when the hydraulic force no longer acts on the housing halves 6, 7. The upper and lower housing halves 6, 7 are therefore set to the first position under the action merely of atmospheric pressure, illustrated by an arrow 14, which means that no external force has to be supplied.

In a preferred embodiment the revolver 9 comprises through-recesses 10, arranged so that on turning of the revolver 9, illustrated by an arrow 11, to predefined turning positions, the recesses 10 coincide with the recesses 8. The through recesses 10 are designed according to the substrates which are to be surface-treated.

The revolver 9 is designed to be interchangeable with a revolver having recesses 10 of a different design shape for the surface treatment of substrates having different dimensions.

It can be seen from FIG. 2 that the housing halves 6, 7 are joined to one another by a flexible sealing member 15, preferably a metal bellows, which is designed to seal internal spaces of the housing 1 off from the atmosphere. The vacuum lock chamber 2 is provided with dynamic sealing members 16, for example O-rings, which peripherally surround the chamber 2. These are compressed when the housing halves 6, 7 are in the first position, thereby sealing the vacuum chamber 2 off from the rest of the housing 1 and the revolver 9. This means that the vacuum lock chamber 2 can be opened to the atmosphere and can be evacuated by means of the vacuum source, without disturbing the vacuum in other parts of the housing 1.

Sealing in the process chambers 3-5 is achieved by the force exerted solely by the atmospheric pressure when inner spaces of the housing 1 are under vacuum and the housing halves are in the first position. In an alternative embodiment the sealing is ensured by providing the process chambers 3-5 with sealing members 16 of the aforementioned type, which peripherally surround the process chambers 3-5 and seal them off from the rest of the housing 1 and the revolver 9.

In the surface treatment of substrates, which is divided up into a number of surface treatment processes, a first substrate is therefore placed in a recess 10 in the revolver 9 in the vacuum lock chamber 2, following which this is closed and evacuated by means of the vacuum source. Thereafter the upper and lower housing halves are separated as described above, following which the revolver 9 is turned, which brings the substrate into the process chamber 3. Once the housing halves 6, 7 have been brought together a first surface treatment process is performed in the process chamber 3, such as cleaning of the surface by RF sputtering, pulsed sputtering in a gaseous atmosphere or metal ionization, in which the metal ions can be created by arc vaporization, for example.

The vacuum lock chamber 2 is isolated from other parts of the housing 1 and can be opened and evacuated whilst surface treatment process are underway in other chambers 3-5 of the housing 1. This means that a second substrate can be placed in a recess 10 in the revolver 9 in the vacuum lock chamber 2. This is vacuum-pumped whilst the first substrate is undergoing a surface treatment process in the process chamber 3.

Once the surface treatment process in the process chamber 3 has been completed, the housing halves 6, 7 are separated a gain, following which the revolver 9 is turned again, placing the substrates in succeeding chambers. In the case above, the first substrate inserted reaches process chamber 4 and the second substrate therefore reaches process chamber 3. After bringing the housing halves 6, 7 together, the respective surface treatment process is performed in each process chamber. In the process chamber 4 a further surface treatment process is performed, such as base-coating the substrate with a metal, a metal alloy or metal ions, for example.

A third substrate is placed in a recess 10 in the vacuum lock chamber 2, following which this is vacuum pumped whilst the above-mentioned surface treatment processes are being performed. The method above is then repeated again, following which the first substrate inserted is in a third process chamber 5, in which a surface treatment process, such as top-coating with an oxide, for example, again takes place The succeeding substrates therefore reach the next chambers in the housing 1 at the same time that the first substrate inserted reaches the process chamber 5.

After a further turning of the revolver 9, therefore, the first substrate inserted into the housing 1 will have undergone the surface treatment process in each of the process chambers 3-5 and again reaches the vacuum lock chamber 2. The first substrate inserted is removed and a fifth substrate is introduced into the housing 1, which means that there is therefore substrate in all chambers 2-5 and that surface treatment processes are being performed in parallel in all process chambers 3-5.

The device is designed to perform most of the different surface treatment processes. For example, the substrate can by and large be coated with all metals in the periodic system and their alloys. Since the chambers are in communication with one another only to a negligible extent, plasma may be used for this purpose and gases may furthermore be used for coating the substrate with nitrides, borides, oxides and carbides. In addition, the device is capable of coating substrate with most chemical compounds, alloys and multiple layers of the aforementioned materials.

In the preferred embodiment of the invention the housing halves 6, 7 have opposing and coincident recesses 8. The surface treatment sources are arranged in the bottom of these recesses 8. The substrates will therefore be situated at the same distance from the surface treatment source, which facilitates optimisation of various surface treatment parameters. In addition, the recesses 8 in both the upper housing half 6 and the lower housing half 7 can be provided with surface treatment sources so that the substrate undergoes a surface treatment process from two directions, which obviates any need to rotate the substrate. If surface treatment sources are provided in both the upper housing half 6 and the lower housing half 7, more efficient use is also made of the source material, since that proportion of the material which does not condense on the substrate instead condenses on the opposing surface treatment source, so that it can be reused. The person skilled in the art will readily appreciate that in an alternative embodiment only one of the housing halves 6; 7 is provided with recesses 8, which may be situated either in the upper housing half 6 or the lower housing half 7, so that the recesses 10 need not be designed as through-recesses.

It must be pointed out that the housing 1 is not limited to one vacuum lock chamber and three process chambers, as shown in FIG. 1. In an alternative embodiment of the present invention the majority of chambers serve as vacuum lock chambers to the other chambers. In addition, the housing 1 may be provided with a number of process chambers equal to the number of surface treatment processes required, the housing being designed so that, on turning the revolver 9 to a predetermined rotational position, the recesses 10 always coincide with recesses 8. In order for the revolver 9 to work properly, however, there must be at least two chambers, one for vacuum locking and one for the selected surface treatment process. It should also be noted that even though FIG. 2 depicts an anticlockwise rotation, viewed from above and illustrated by the arrow 11, the revolver 9 is designed to be rotatable both anticlockwise and clockwise, Furthermore, in an alternative embodiment one or more of the chambers communicates with a separate, individual vacuum source for a more efficient reduction of the pressure and in order to preclude the risk of gas being transferred from one chamber to another.

The invention claimed is:

1. A device for carrying out a surface treatment of a substrate under vacuum, comprising:
 a housing including at least two chambers communicating with at least one vacuum source, at least one of the chambers being designed to serve as a vacuum lock chamber which can be opened to atmosphere and in which the substrate can be introduced and removed to access the remaining chambers,
 wherein the housing includes an upper housing half and a lower housing half peripherally joined by a flexible sealing member, at least one of the housing halves having at least two symmetrically distributed recesses, which are intended to constitute at least some of the chambers, together with a revolver pivotally mounted between the housing halves and including revolver recesses in which the substrate is intended to be placed,
 wherein outer walls of the upper and lower housing halves under an action of a force-generating member are designed to be moved from a first position in which the upper and lower housing halves, through tight, sealing contact with the revolver, prevent rotation thereof, to a second position in which the upper and lower housing halves are separated from the revolver in order to permit rotation of the latter to predefined positions, and
 wherein at least one of the revolver recesses at least partially coincides with one of the chambers, allowing the substrate to be moved between the chambers.

2. The device according to claim 1, wherein from the second position, the upper and lower housing halves are designed to assume the first position when the force generating member no longer acts between the housing halves.

3. The device according to claim 1, wherein the at least two symmetrically distributed recesses of both upper and lower housing halves are opposing and co-incident housing half recesses and the revolver recesses are through-recesses.

4. The device according to claim 1, wherein the vacuum lock chamber is provided peripherally with sealing members, designed to seal the vacuum lock chamber off from the remainder of the housing and from the revolver when the housing halves are in the respective first position.

5. The device according to claim 1, wherein at least one of the remaining chambers is provided peripherally with sealing members designed to seal off from the remainder of the housing and from the revolver when the housing halves are in the respective first position.

6. The device according to claim 1, wherein the chambers are designed to communicate with one and the same vacuum source.

7. The device according to claim 1, wherein at least one of the chambers is designed to communicate with a vacuum source, which is only designed to communicate with the aforesaid chamber.

8. The device according to claim 1, wherein the flexible sealing member is a metal bellow.

9. The device according to claim 1, wherein the flexible sealing member is an O-ring.

10. The device according to claim 1, wherein the force-generating member is a hydraulic cylinder.

11. The device according to claim 1, wherein the revolver recesses are through-recesses.

12. The device according to claim 1, wherein only one of the upper and lower housing halves has the at least two symmetrically distributed recesses.

13. The device according to claim 12, wherein the at least two symmetrically distributed recesses in only one of the upper and lower housing halves are opposing and co-incident with the revolver recesses.

14. The device according to claim 12, wherein the revolver recesses are not through-recesses.

* * * * *

UNITED STATES PATENT AND TRADEMARK OFFICE
CERTIFICATE OF CORRECTION

| | | |
|---|---|---|
| PATENT NO. | : 7,993,456 B2 | |
| APPLICATION NO. | : 10/534723 | |
| DATED | : August 9, 2011 | |
| INVENTOR(S) | : Henrik Ljungerantz et al. | |

It is certified that error appears in the above-identified patent and that said Letters Patent is hereby corrected as shown below:

Title Pg, Item (30) Foreign Application Priority Data, should read as follows:

--(30) Foreign Application Priority Data

November 13, 2002 (SE) .................................0203332-2--.

Signed and Sealed this
Fourteenth Day of February, 2012

David J. Kappos
*Director of the United States Patent and Trademark Office*